(12) United States Patent
Wang et al.

(10) Patent No.: US 6,277,717 B1
(45) Date of Patent: Aug. 21, 2001

(54) FABRICATION METHOD FOR A BURIED BIT LINE

(75) Inventors: Chuan-Fu Wang, Taipei Hsien; King-Lung Wu, Tainan Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/567,669

(22) Filed: May 9, 2000

(51) Int. Cl.[7] .................................................. H01L 21/20
(52) U.S. Cl. ........................... 438/584; 438/253; 438/396
(58) Field of Search ................................... 438/253, 263, 438/296, 396, 584, 387, 564, 674

(56) References Cited

U.S. PATENT DOCUMENTS 5,102,814 * 4/1992 Woo ....................................... 438/263
5,369,048 * 11/1994 Hsue ..................................... 438/396
5,753,551 * 5/1998 Sung ..................................... 438/253

* cited by examiner

Primary Examiner—David Neims
Assistant Examiner—Phuc T. Dang
(74) Attorney, Agent, or Firm—Thomas, Kayden, Horstemeyer & Risley, LLP (57) ABSTRACT

A fabrication method for a borderless buried bit line is described. A substrate wherein a plurality of word lines and source/drain regions formed thereon is provided. A first insulation material is formed over the substrate and a node landing pad is formed in the first insulation material, wherein the node landing pad is covered by a second insulation material. A bit line contact is further formed in the first insulation material, wherein the bit line contact is covered by a third insulation material. Therefore, a trench is further formed along the sides of the bit line contact, traversing across the first insulation material. A partial filling of the trench with a conductive material, followed by filling the trench with a fourth insulation layer to complete the formation of the buried bit line.

18 Claims, 9 Drawing Sheets

FABRICATION METHOD FOR A BURIED BIT LINE

BACKGROUND OF THE INVENTION

1. Field of the Invention

The present invention relates to a fabrication method for a memory device. More particularly, the present invention relates to a fabrication method for a buried bit line.

2. Description of the Related Art

The escalating demand of a higher integration in semiconductor devices has led to the development of devices with sub-micron features. Smaller features allow the reduction in the performance degrading capacitance and resistance. In addition, smaller features would result in smaller chips, while maintaining the same level of integration that is acquired for semiconductor chips fabricated with the larger features. As a result, a greater number of the denser, smaller chips can be obtained from a specific substrate size. Thus, a lower manufacturing cost is obtained for an individual chip.

A memory device, for example, a typical DRAM cell, is comprised of a capacitor structure, overlying a transfer gate transistor and connecting to the source or a drain region of the transfer gate transistor. The bit line of the DRAM cell is usually comprised of a metal line traversing an insulator layer and contacting a source or a drain region of the transfer gate through a contact hole in the insulator layer. However, for these structures to be all formed in a DRAM cell, design rules for minimizing area and ensuring adequate process margin are required.

Figure 1A:
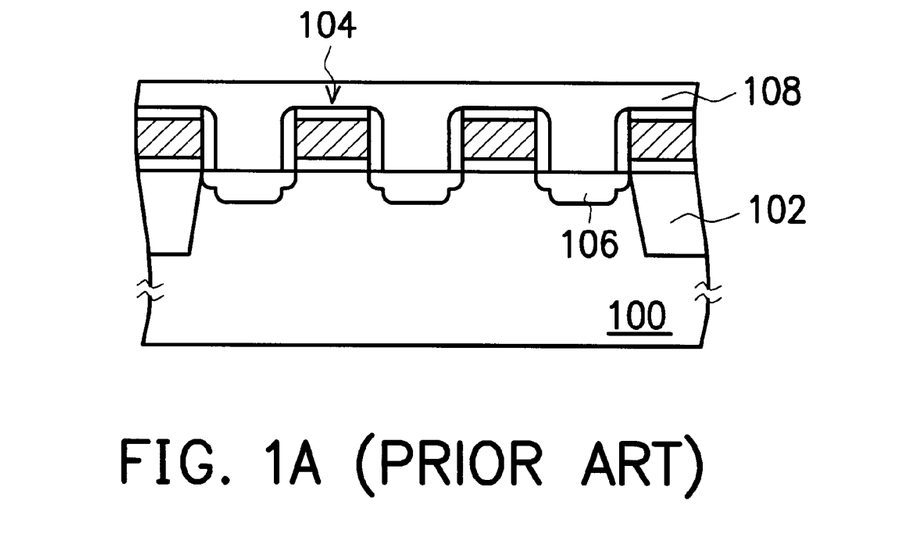
FIGS. 1A to 1D are schematic, cross-sectional views showing the manufacturing of a DRAM cell according to the prior art.

FIGS. 1A to 1D are schematic cross-sectional views showing the manufacturing of a conventional DRAM cell. As shown in FIG. 1A, a shallow trench isolation (STI) structure 102 is formed in a substrate 100. A plurality of word lines 104 is formed over the substrate 100 and the STI structure 102. A plurality of source/drain regions 106 are formed in the substrate 100 between the word lines 104. An insulation material is deposited over the word lines 104 and into the space between the word lines to form an insulation layer 108.

Figure 1B:
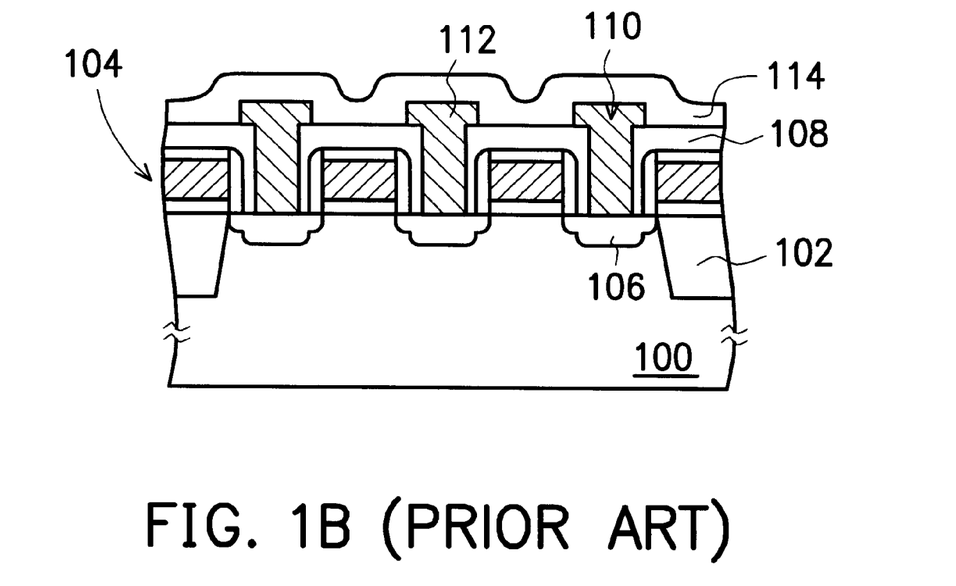

Referring to FIG. 1B, photolithography and etching operations are conducted to form the contact openings 110 in the insulation layer 108. The contact openings 110 expose portions of the source/drain regions 106. Conductive material is then deposited into the openings 110 and over the insulation layer 108. The conductive layer is patterned to form the landing pads 112. An insulation layer 114 is subsequently from on the resultant structure.

Figure 1C:
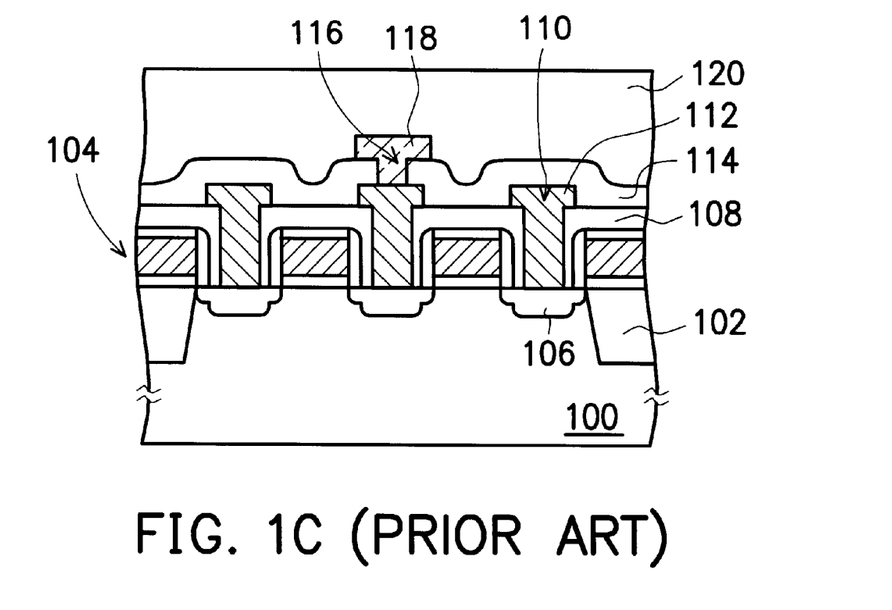

As shown in FIG. 1C, photolithography and etching operations are carried out to form a bit line opening 116 in the insulation layer 114. The bit line opening 116 exposes a portion of the landing pad 112. A conductive material is then deposited on the insulation layer 114, filling the bit line opening 116. The conductive material is then patterned to form the bit line 118, which is electrically connected to the landing pad 112. An insulation layer 120 is further formed over the insulation layer 114 and the bit line 118.

Figure 1D:
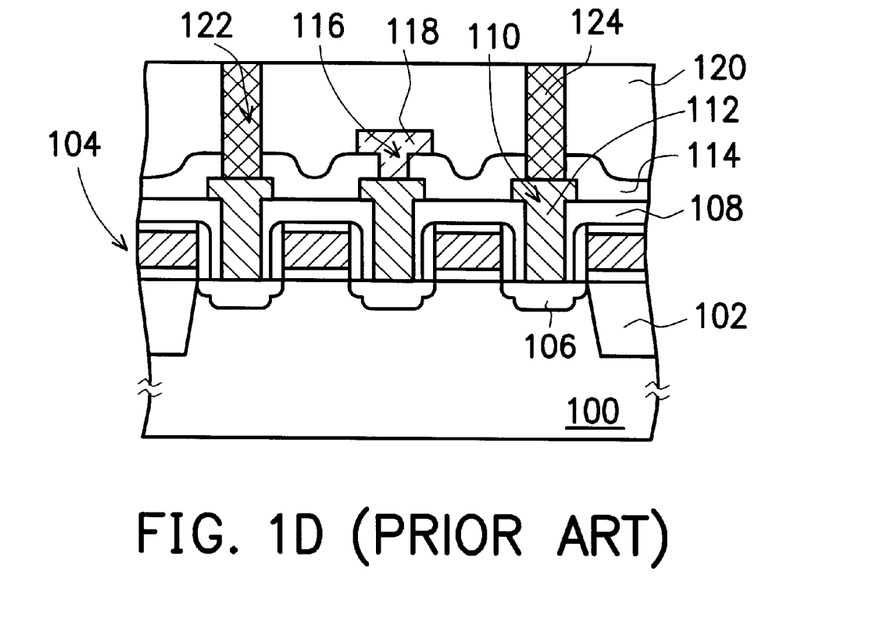

Continuing to FIG. 1D, node contact openings 122 are formed in the insulation layer 120. The node contact openings 118 expose a portion of the landing pad 112 not yet electrically connected to the bit line. A node contact 124 is formed inside each node contact openings 122. Capacitors (not shown in Figure) are subsequently formed above the substrate 100 to complete the fabrication of a DRAM cell.

Figure 2:
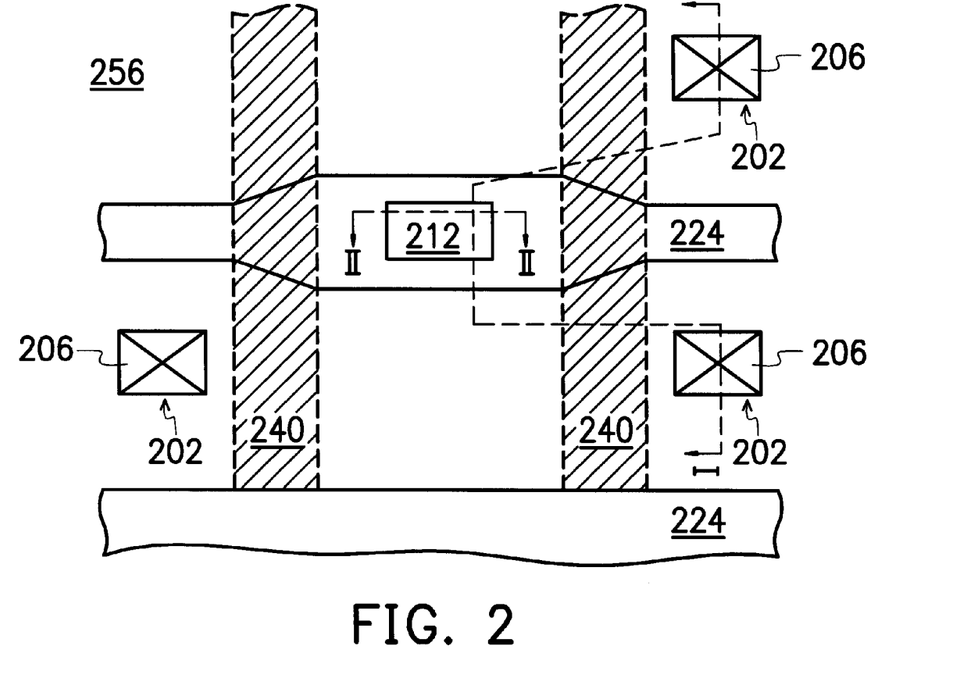
FIG. 2 is a schematic, top view of a memory device comprising a buried bit line formed according to a preferred embodiment of the present invention.

In the aforementioned process, the node contact openings 122 are formed after a structure of multiple conductive layers (including word lines and bit lines) isolated from each other by a plurality of insulation layers (108, 114 and 120) is formed. Consequently, there is a considerable height difference between a peripheral circuit region and a device region in a silicon chip. This often leads to a subsequent planarization problem. Additionally, as the level of device integration continues to increase, the node contact openings formed after the bit line have a bigger aspect ratio. With a big aspect ratio, the node contact openings 122 are more difficult to form, resulting in a node contact 124 with a low conductivity. Hence, the electrical contact of the node contact 124 is poor. Furthermore, with an increased integration for the integrated circuit, the problem of misalignment becomes more significant. The node contact openings (206 as illustrated in FIG. 2) are typically formed near the cross-section between the word lines and the bit lines. It is thus a great challenge to secure the alignment margin when forming the node contact openings. Therefore, if a misalignment occurs during the contact opening formation, the node contact opening may expose the bit line or word line. When a doped polysilicon layer is subsequently deposited in the contact opening makes contact with the exposed bit line or word line, an electrical short circuit and a damage to the semiconductor device may result.

SUMMARY OF THE INVENTION

Based on the foregoing, a method to fabricate a memory device comprising a buried bit line is provided. According to this version of the present invention, a substrate comprising a plurality of word lines formed thereon is provided. A first insulation layer, for example, a dielectric layer, is formed over the substrate, covering the word lines. A node landing pad is formed in the first insulation layer, wherein the node landing pad is covered with a second insulation layer of a first thickness. A bit line contact is then formed in the first insulation layer, and the bit line contact is covered with a third insulation layer of a second thickness, wherein the second thickness is greater than the first thickness. A trench is further formed in the first insulation along the sides of the bit line contact and is extended across the first insulation layer. After this, a conductive material partially fills the trench to form a borderless buried bit line. A fourth insulation layer with a third thickness is further deposited to fill the remaining space in the trench, wherein the third thickness is greater than the first thickness. Thereafter, a planarization procedure is conducted on the surface of the first insulation layer to remove the second insulation layer, exposing the node landing pad. A bottom electrode is subsequently formed on the exposed landing pad.

According to this version of the present invention, the node contact opening is formed before the formation of the bit line. The difficulty in securing an alignment margin for the node contact opening formed at the cross-section between the bit lines and the word lines is mitigated. Furthermore, the node landing pad and the buried bit line are covered by insulation materials. The potential problem of a misalignment when forming the bottom electrode and the buried bit line, respectively, leading to the exposure of the conductive units and a subsequent electrical short circuit are thus revented.

Additionally, the buried bit line and the node landing pads are embedded in the came insulation layer, the number of dielectric layers is reduced. Moreover, the node contact opening has a smaller aspect ratio. When the node landing pad is formed in the node contact opening, a better step coverage of the conductive layer is obtained. Since both the bit lines and the node contacts are embedded in the first insulation layer, a planarized surface is thus provided to facilitate the subsequent manufacturing processes.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

FIGS. 3A–8A are schematic, cross-sectional views of FIG. 2 along the line I—I, showing the progress of the manufacturing of a memory device comprising a buried bit line according to a preferred embodiment of the present invention.

FIGS. 4B–7B are schematic, cross-sectional views of FIG. 2 along the line II—II, showing the manufacturing of a memory device comprising a buried bit line according to a preferred embodiment of the present invention.

FIGS. 3C–7C are schematic, top views showing the manufacturing of a memory device in FIG. 2 at the correspondingly manufacturing steps of the memory device illustrated in FIGS. 3A–7A, respectively.

DESCRIPTION OF THE PREFERRED EMBODIMENT

The fabrication method for a buried bit-line, accordance with the present invention is described with reference to FIG. 2, FIGS. 3A–8A, FIGS. 4B–7B and FIGS. 3C–7C.

FIG. 2 is a schematic, top view of a memory device, for example, a DRAM cell, comprising a buried bit line formed according to a preferred embodiment of the present invention. Referring to FIG. 2, node contact openings and node landing pads are denoted by the reference numerals 202, 206, respectively. The bit line contact 212 is buried in the insulation layer 256. The bit line 224 is extended along the sides of the bit line contact 212, traversing across the insulation layer 256. Word lines, which are covered by the insulation layer 256, are denoted by the reference numeral 240.

FIGS. 3A–8A are schematic, cross-sectional views of FIG. 2 along the line I—I, showing the progress of the manufacturing of a memory device comprising a buried bit line according to a preferred embodiment of the present invention. FIGS. 4B–7B are schematic, cross-sectional views of FIG. 2 along the line II—II, showing the manufacturing of a memory device comprising a buried bit line according to a preferred embodiment of the present invention. FIGS. 3C–7C are schematic, top views showing the manufacturing of a memory device, which correspond to the manufacturing step of the memory device illustrated in FIGS. 3A–7A, respectively.

Figure 3A:
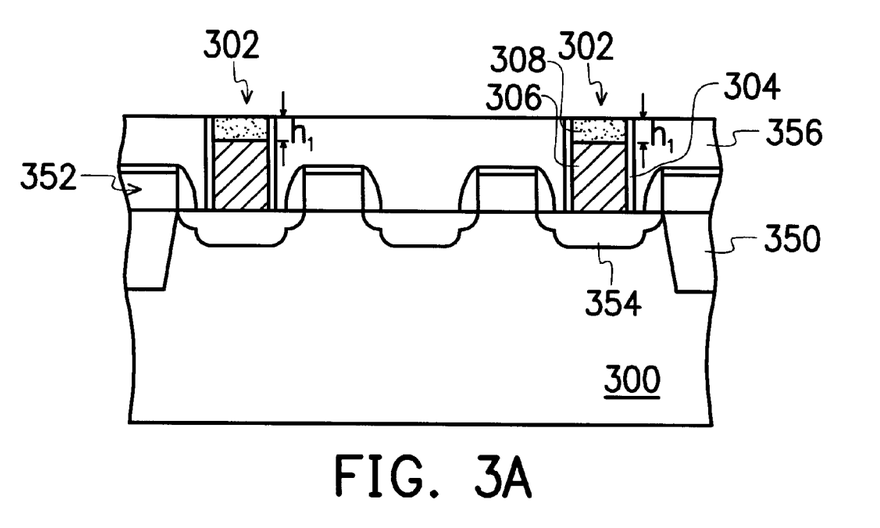

Referring to FIG. 3A, a substrate 300 having device isolation structures 350 formed thereon is provided. The isolation structures 350, for example, shallow trench isolation, partition the substrate 300 into active and inactive regions. A plurality of word lines 352 are formed on the substrate 300. A plurality of source/drain regions 354 are also formed in the substrate 300 between the word lines 352. An insulation material is then deposited over the word lines 352 and into the space between the word lines to form the insulation layer 356. Photolithography and etching are then conducted to create a plurality of openings in the substrate 300. Those openings are formed as the node contact openings 302, which expose some of the source/drain regions.

Figure 3C:
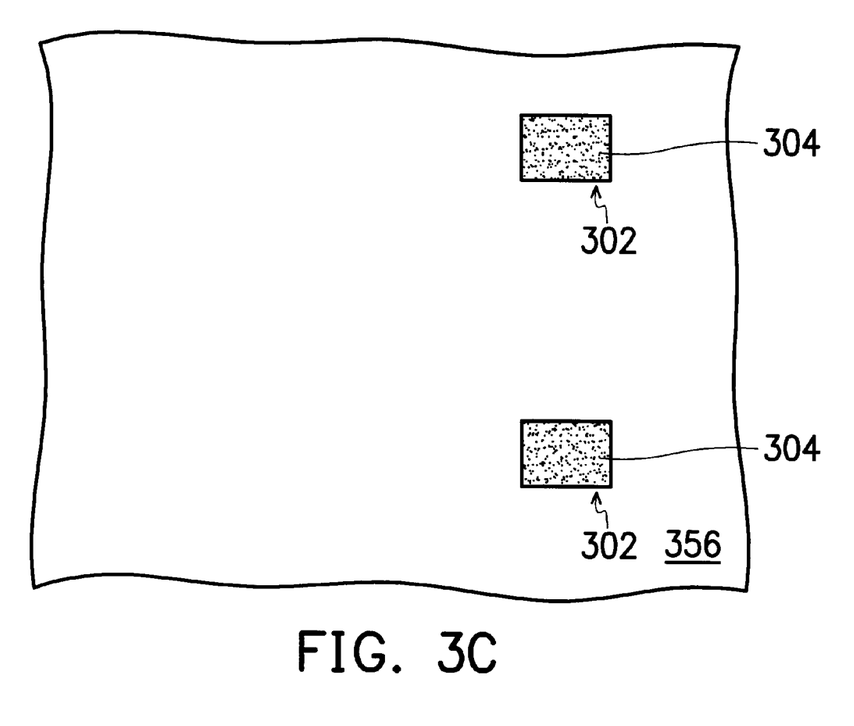

Still referring to FIG. 3A, a conformal silicon nitride layer is then formed, for example, by chemical vapor deposition, on the surface of the insulation layer 356 and along the surface of the node contact openings 302. Anisotropic etching is further conducted to remove the part of the silicon nitride layer on the insulation layer 356 and at the bottom surface of the node contact openings 302. A silicon nitride liner layer 304 is thus formed on the sidewalls of the node contact openings 302. Thereafter, a conductive material, such as polysilicon or refractory metal silicide, is formed over the substrate 300, filling the node contact opening 302. The conductive material is then etched back to form the node landing pads 306, which are electrically coupled to some of the source/drain regions, in the node contact openings 302. The node landing pads 306 are etched back to a height of about "h1" below the surface of the insulation layer 356. An insulation material, for example, a silicon nitride layer, is then formed over the insulation layer 356 and the node landing pads 306, filling the remaining space in the node contact openings 302. The insulation material is then etched back to form the insulation layer 308 which has a thickness of about 'h1" in the node contact openings 302 above the node landing pads 306. FIG. 3C is the top view of the memory device at the corresponding manufacturing step of the memory device illustrated in FIG. 3A.

Figure 4A:
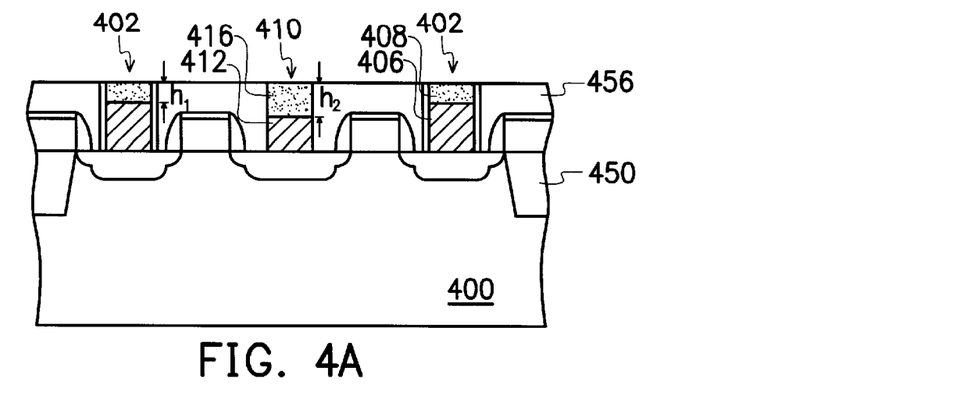
Figure 4B:
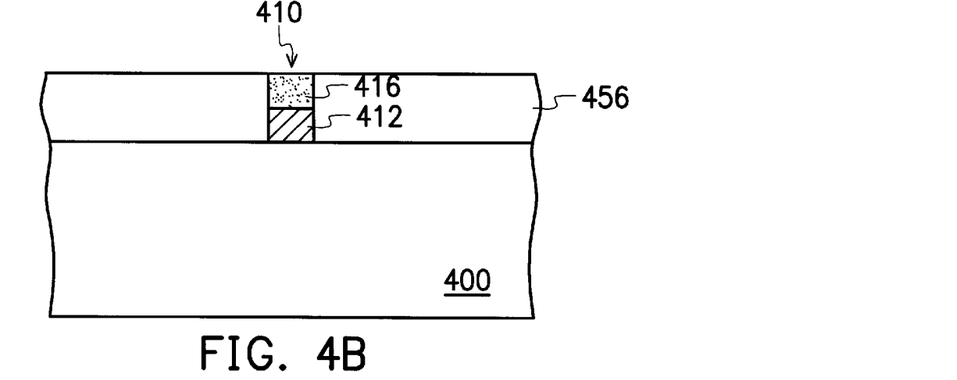
Figure 4C:
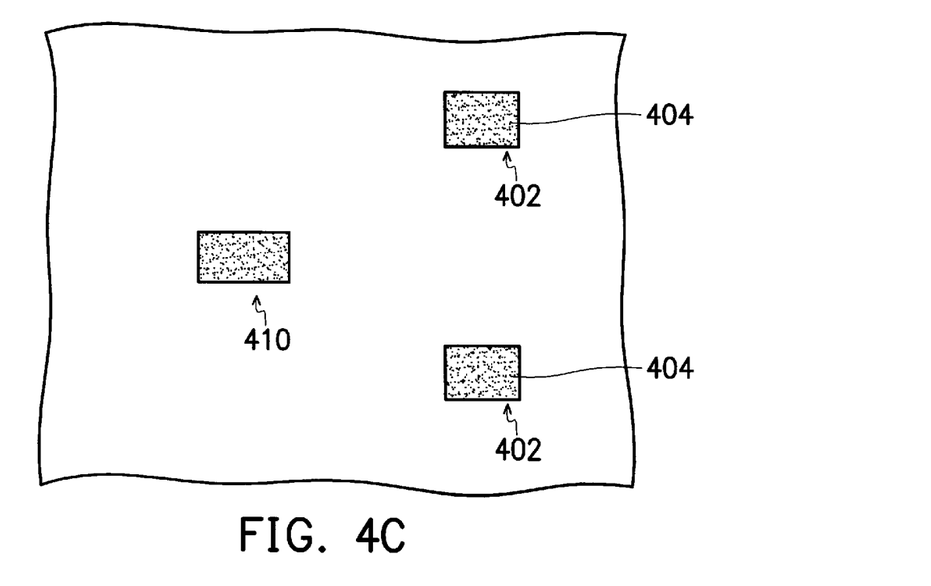

Referring to FIGS. 4A and 4B, photolithography and etching are conducted to form a bit line contact opening 410 in the insulation layer 456. Thereafter, a conductive material, such as polysilicon layer or refractory metal silicide, is formed over the insulation layer 456, filling the bit line contact opening 410. The conductive material is then etched back to form the self aligned bit-line contact 412 in the bit line contact opening 410. The bit line contact 412 is etched back to a height of about "h2" below the surface of the insulation layer 456. An insulation material, for example, a silicon nitride layer, is further deposited over the insulation layer 456, filling the remaining space in the bit line contact opening 410. The insulation material is then etched back to form the insulation layer 416 above the bit line contact 412 in the bit line contact opening 410. The bit line contact 412 is electrically coupled to the source/drain regions 454 in the substrate 400. The thickness of the insulation layer 416 is thus equal to "h2", and "h2" is greater than the thickness "h1" of the insulation layer 408 above the landing pads 406 in the node contact openings 402. FIG. 4C is the top view of the memory device at the corresponding manufacturing step of the memory device illustrated in FIGS. 4A and 4B.

Figure 5A:
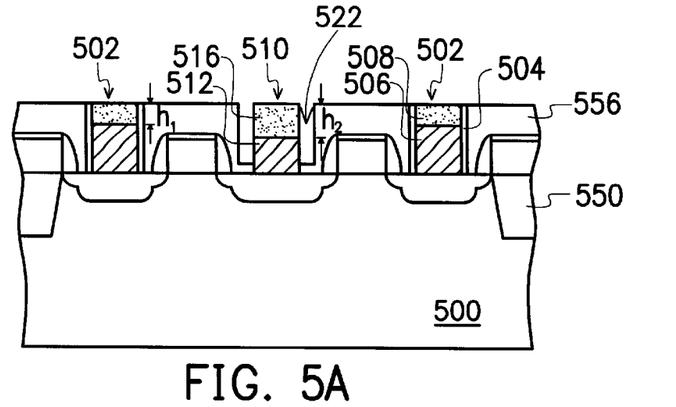
Figure 5B:
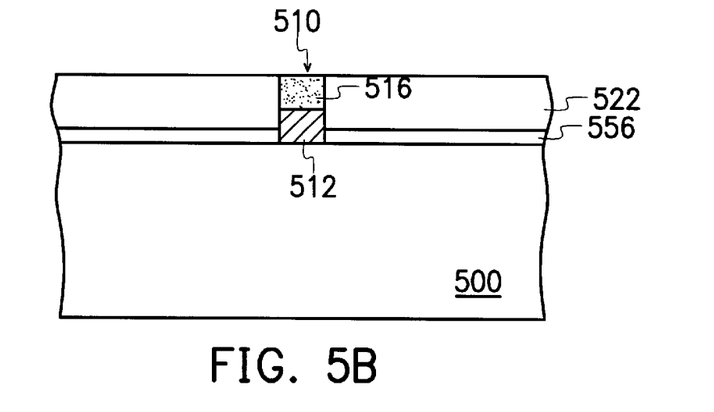
Figure 5C:
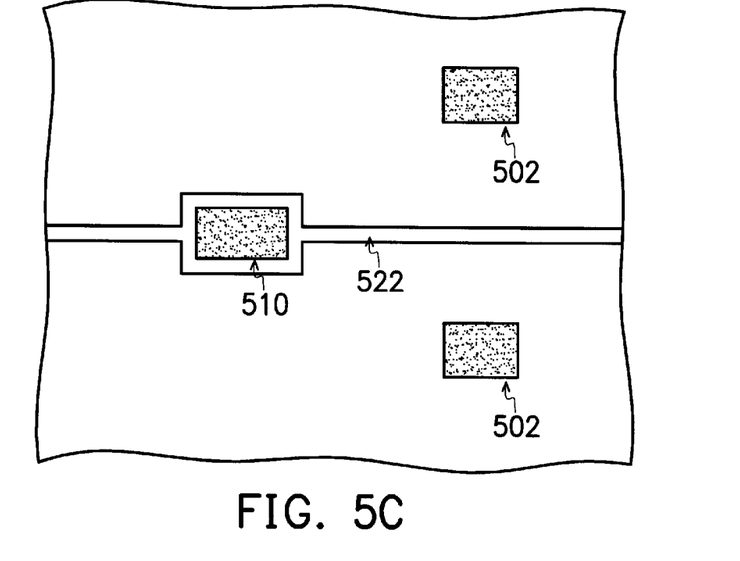

As shown in FIGS. 5A and 5B, photolithography and etching procedures are conducted to form a trench 522 in the insulation layer 556 located above the substrate 500. The trench 522 extends along the sides of the bit line contact opening 510 and traverses across the insulation layer 556. In the preferred embodiment of the present invention, the node landing pads 506 (as illustrated in FIG. 5A) are enclosed by insulation layer 502 and the liner layer 504. The potential problem of a misalignment when forming the trench 522, leading to an exposure of the node landing pads 506 and issues of the shorting of the conductive devices are prevented. FIG. 5C is the top view of the memory device at the corresponding manufacturing step of the memory device.

Figure 6A:
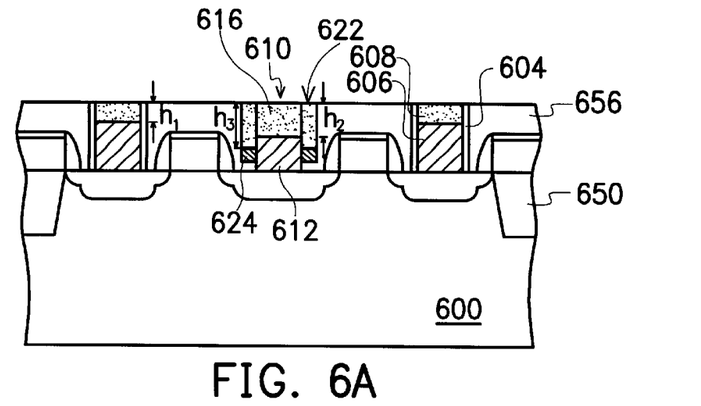
Figure 6B:
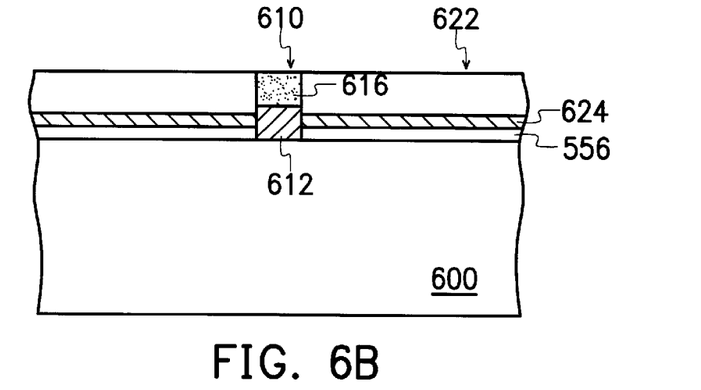
Figure 6C:
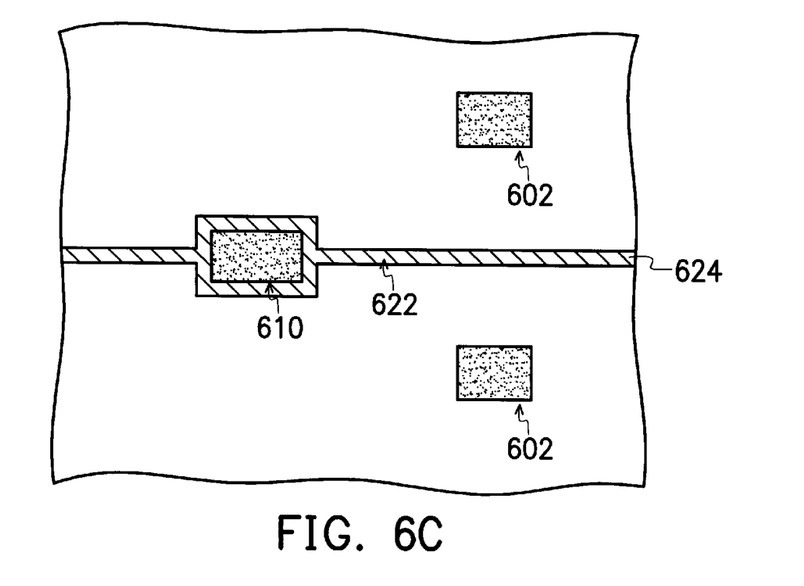

Continuing to FIGS. 6A to 6B, a conductive material, for example, polysilicon or refractory metal silicide, is then formed over the resultant structure, filling the trench 622. The conductive material is further being etched back to form a borderless buried bit line 624. The conductive material is etched back to a height of about "h3" below the surface of the insulation layer 656 above the substrate 600, wherein "h3" is not less than "h2" and "h3" is greater than "h1". FIG. 6C is the top view of the memory device at the corresponding manufacturing step of the memory device illustrated in FIGS. 6A and 6B.

Figure 7A:
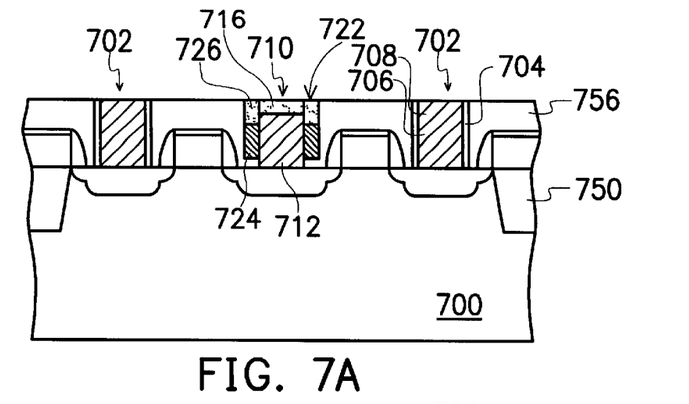
Figure 7B:
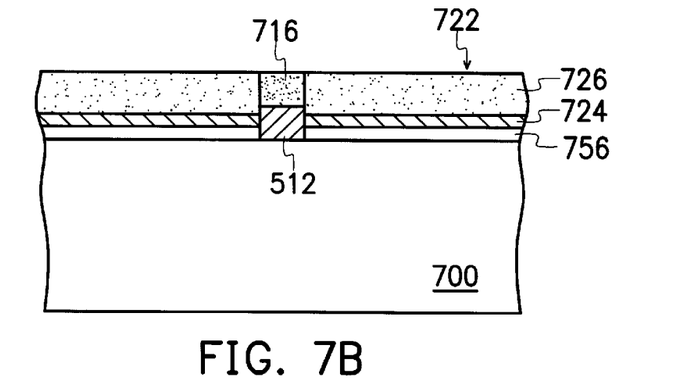
Figure 7C:
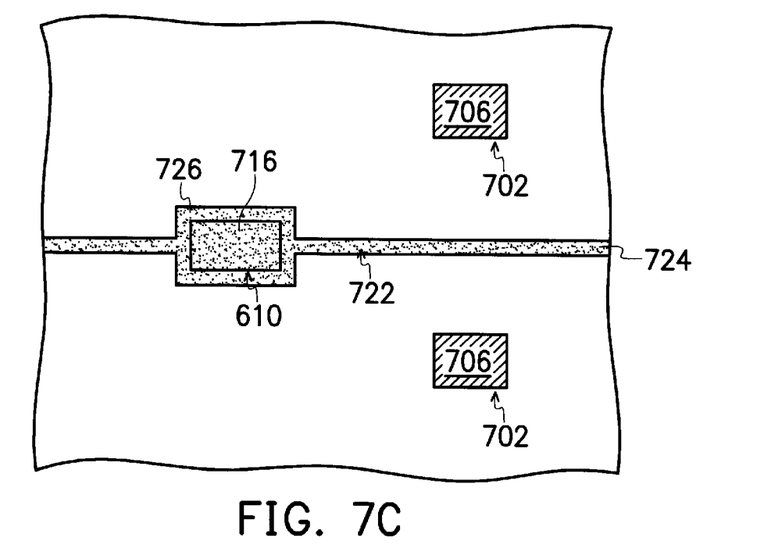

Referring to FIGS. 7A and 7B, an insulation layer 726, for example, a silicon nitride layer, that fills the remaining space of the trench 722 is formed above the buried bit line 724. The insulation layer 726 is preferably formed by depositing an insulation material into the trench 722 and on the insulation layer 756. A planarization procedure such as chemical-mechanical polishing is then carried out to remove the insulation material above the insulation layer 756. The planarization procedure is continued to remove the insulation layer 756 until the insulation layer 608 (as in FIG. 6A) in the node contact openings 702 above the node landing pads 706 and a portion of the of the insulation layer 716 in the bit line contact opening 710 above the buried bit line 724 are removed. Since the original thickness "h2" of the insulation layer 716 and the original thickness "h3" of the insulation layer 726 are greater the thickness "h1" of the insulation layer 608, portions of the insulation layers 716 and 726 are remained after the complete removal of the insulation layer 608 above the node landing pads 706. FIG. 7C is the top view of the memory device at the corresponding manufacturing step of the memory device illustrated in FIGS. 7A and 7B.

Figure 8A:
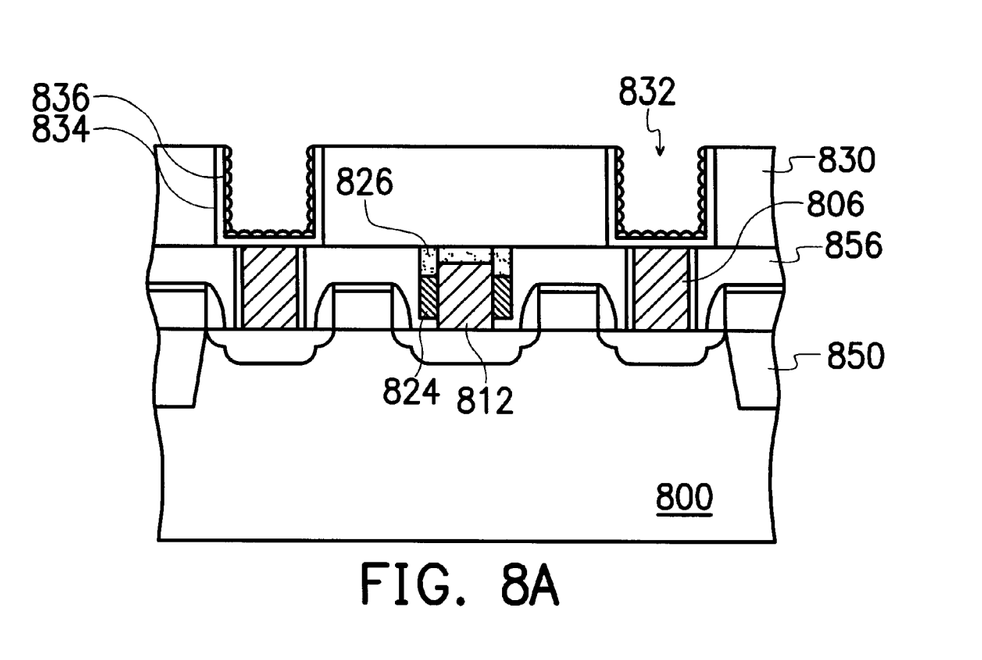

Continuing to FIG. 8A, an insulation layer 830 is then formed on the resultant structure. Photolithography and etching are conducted to define openings 832 in the insulation layer 830, exposing the node landing pads 806. Since the insulation layer 826 is formed above the buried bit line 824, the buried bit line 824 is prevented from being exposed even when a misalignment occurs when forming the opening 832. Thereafter, a conformal amorphous silicon layer is formed on the substrate 800, covering the sidewalls of the opening 832 and the insulation layer 830 (not shown in Figure). Furthermore, using the insulation layer 830 as a polishing stop layer, the amorphous silicon layer covering the surface of the insulation layer 830 is removed, leaving the amorphous silicon layer 834 in the opening 832. A selective hemispherical grain polysilicon layer 836 is further formed on the surface of the amorphous silicon layer 834 in the opening 832. The insulation layer 830 is subsequently removed to complete the formation of the bottom electrode (not shown in Figure).

According to the preferred embodiments of the present invention, the node contact opening is formed before the fabrication of the bit line. The difficulty in securing an alignment margin for the node contact opening formed at the cross-section between the bit lines and the word lines as in the conventional practice is mitigated. Furthermore, the node landing pads of the present invention are enclosed by insulation materials. Similarly, the buried bit line is covered by an insulation layer. The problems of misalignments when forming the bottom electrode and the buried bit line, respectively, leading to the exposure of the conductive units and a subsequent electrical short circuit are thus prevented.

Additionally, the buried bit line and the node landing pads are embedded in the same insulation layer, the number of dielectric layers is reduced. Hence, the node contact opening has a smaller aspect ratio. When the node landing pad is formed in the node contact opening, a better step coverage of the conductive layer is obtained. Moreover, since both the bit lines and the word lines are embedded in the substrate, a planarized surface is thus provided to facilitate the subsequent manufacturing processes in the absent of the height differences.

In addition, in the conventional manufacturing process for a landing pad, two masks are needed to complete the process. One mask to define the openings and the other mask to define the landing pad. In the present invention, a single mask is required to form the landing pad, reducing the complexity of the manufacturing process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a memory device comprising a buried bit line, the method comprising:

providing a substrate comprising device isolation structures;

forming a plurality of word lines on the substrate;

forming a plurality of source/drains regions on sides of the word lines in the substrate;

forming a first insulation layer on the substrate to cover the word lines and to fill the space between the word lines;

forming a plurality of first openings in the first insulation layer to expose some of the source/drain regions, wherein the first openings serve as node contact openings;

forming a liner layer along sidewalls of the node contact openings;

partially filling the node contact openings with a first conductive material, wherein the first conductive material serves as node landing pads;

filling a remaining space of the node contact openings with a second insulation layer, wherein the second insulation layer has a first thickness;

forming a plurality of second openings in the substrate, wherein the second openings serve as bit line contact openings;

partially filling the bit line contact openings with a second conductive material, wherein the second conductive material serves as bit line contacts;

filling a remaining space of the bit line contact openings with a third insulation layer, wherein the third insulation layer has a second thickness, and the second thickness is greater than the first thickness of the second insulation layer;

forming a plurality of trenches in the first insulation layer, wherein the trenches extend along the sides of the bit line contact openings and traverse across the first insulation layer;

partially filling the trenches with a third conductive material, wherein the third conductive material serves as buried bit lines;

filling a remaining space of the trenches with a fourth insulation layer, wherein the fourth insulation material has a third thickness and the third thickness is greater than the first thickness;

planarizing a surface of the first insulation layer until the second insulation material is removed to expose the landing pad; and forming a bottom electrode on the exposed surface of the node landing pad.

2. The fabrication method according to claim 1, wherein a material for the first conductive material, the second conductive material and the third conductive material includes polysilicon.

3. The fabrication method according to claim 1, wherein a material for the first conductive material, the second conductive material and the third conductive material includes refractory metal silicide.

4. The fabrication method according to claim 1, wherein a material for the first insulation layer, the second insulation layer, the third insulation layer and the fourth insulation layer includes silicon nitride.

5. The fabrication method according to claim 1, wherein a material for the liner layer includes silicon nitride.

6. The fabrication method according to claim 1, wherein partially filling the node contact openings with the first conductive material includes:

depositing the first conductive material to fill the node contact openings; and etching back a portion of the first conductive material in the node contact openings.

7. The fabrication method according to claim 1, wherein partially filling the bit line contact openings with the second conductive material includes:

depositing the second conductive material to fill the bit line contact openings; and etching back to remove a portion of the second conductive material in the bit line contact openings.

8. The fabrication method according to claim 1, wherein partially filling the trenches with the third conductive material includes:

depositing the third conductive material to fill the trenches; and etching back to remove a portion of the third conductive material in the trenches.

9. The fabrication method according to claim 1, wherein the third thickness is not less than the second thickness.

10. The fabrication method according to claim 1, wherein planarizing the surface of the first insulation layer includes chemical mechanical polishing.

11. The fabrication method for according to claim 1, wherein after planarizing the surface of the first insulation layer, portions of the third insulation layer and the fourth insulation layer are remained.

12. The fabrication method according to claim 1, wherein forming the bottom electrode further includes:

forming a fifth insulation layer on the planarized surface of the first insulation layer, covering the exposed landing pad;

defining an opening in the fifth insulation layer to expose the landing pad;

forming a conformal amorphous silicon layer in the opening;

forming a selective hemispherical grain polysilicon layer on the conformal amorphous silicon layer; and removing a remaining portion of the fifth insulation layer.

13. A fabrication method for a borderless buried bit line of a memory device, wherein a substrate comprising a plurality of word lines formed thereon and source/drain regions formed on sides of the word lines is provided, the method comprising:

forming a first insulation layer over the substrate to cover the word lines;

forming a node landing pad in the first insulation layer to electrically coupled to the source/drain region, wherein the node landing pad is covered with a second insulation material of about "h1" thick;

forming a bit line contact in the first insulation layer to electrically coupled with the source/drain region, wherein the bit line contact is covered with a third insulation material of about "h2" thick, and "h2" is greater than "h1";

forming a trench along sides of the bit line contact in the first insulation layer, wherein the trench traverses across the first insulation layer;

partially filling the trench with a first conductive material to form a borderless buried bit line; and filling a remaining space in the trench with a fourth insulation material with a thickness of about "h3", wherein "h3" is greater than "h1".

14. The fabrication method according to claim 13, wherein the node landing pad is formed by:

patterning the first insulation layer by photolithography and etching to form a first opening in the first insulation layer;

forming a liner layer in the first opening;

filling the first opening with a second conductive material; and etching back the second conductive material to about "h1" below a surface of the first insulation layer.

15. The fabrication method according to claim 13, wherein forming a bit line contact in the first insulation layer further includes:

patterning the first insulation layer by photolithography and etching to form a second opening in the first insulation layer;

filling the second opening with a third conductive material; and etching back the third conductive material to about "h2" below the surface of the first insulation layer.

16. The fabrication method for according to claim 13, wherein a material for the first conductive material, the second conductive material and the third conductive material includes polysilicon.

17. The fabrication method according to claim 13, wherein a material for the first insulation material, the second insulation material, the third insulation material and the fourth insualtion layer includes silicon nitride.

18. The fabrication method according to claim 13, wherein the method further includes planarizing the surface of the first insualtion layer until the node landing pad is exposed.

* * * * *